(12) United States Patent
Pearl

(10) Patent No.: US 7,105,843 B1
(45) Date of Patent: Sep. 12, 2006

(54) METHOD AND SYSTEM FOR CONTROLLING FOCUSED ION BEAM ALIGNMENT WITH A SAMPLE

(75) Inventor: Asher Pearl, Kadimah (IL)

(73) Assignee: Applied Materials, Israel, Ltd., Rehovot (IL)

( * ) Notice: Subject to any disclaimer, the term of this patent is extended or adjusted under 35 U.S.C. 154(b) by 0 days.

(21) Appl. No.: 11/140,017

(22) Filed: May 27, 2005

(51) Int. Cl.
*G01N 1/00* (2006.01)
*H01J 37/244* (2006.01)
*H01J 37/302* (2006.01)
*G21G 5/00* (2006.01)

(52) U.S. Cl. .............................. 250/492.22; 250/492.2; 250/492.3

(58) Field of Classification Search ............. 250/492.2, 250/492.22, 492.3
See application file for complete search history.

(56) References Cited

U.S. PATENT DOCUMENTS

| | | | |
|---|---|---|---|
| 4,443,703 A * | 4/1984 | Shimazu et al. | 250/491.1 |
| 5,132,545 A * | 7/1992 | Shono et al. | 250/492.2 |
| 6,177,680 B1 * | 1/2001 | Dick et al. | 250/492.22 |
| 6,627,903 B1 * | 9/2003 | Hirayanagi | 250/491.1 |
| 6,627,905 B1 * | 9/2003 | Hirayanagi | 250/492.22 |
| 6,825,480 B1 * | 11/2004 | Watanabe et al. | 250/491.1 |
| 2004/0066454 A1 * | 4/2004 | Otani et al. | 348/188 |
| 2004/0256576 A1 * | 12/2004 | Gierak et al. | 250/492.3 |

* cited by examiner

*Primary Examiner*—Nikita Wells
*Assistant Examiner*—Bernard E. Souw
(74) *Attorney, Agent, or Firm*—Oren Reches

(57) ABSTRACT

A method for calibrating operational parameters of a charged particle beam device comprises generating a plurality of distinct spots on a specimen, each spot being generated in response to adjusted operational parameters of the charged particle beam device, and registering said respective operational parameters.

23 Claims, 6 Drawing Sheets

METHOD AND SYSTEM FOR CONTROLLING FOCUSED ION BEAM ALIGNMENT WITH A SAMPLE

FIELD OF THE INVENTION

This invention relates to a system and method for calibrating operational parameters of a charged particle beam device.

BACKGROUND OF THE INVENTION

There are known in the art charged particle beam devices. For example, scanning electron microscopes are disclosed in U.S. Pat. No. 5,659,172 of Wagner which describes a method for reliable defect detection using multiple perspective Scanning Electron Microscope (SEM) images. A SEM usually includes an electron gun for generating an electron beam, a SEM lens system for focusing and converging the electron beam, a deflection coil for deflecting the electron beam, a detector for detecting electrons, such as secondary emitted electrons or reflected electrons that are emitted/reflected from an object and a processor that is operative to construct SEM images in response to detection signals provided from the detector. Usually, the electron gun, the SEM lens system and the deflection coil are located within a column, which is commonly referred to as SEM column. The resolution of a SEM and its power consumption are inversely proportional to the distance between the SEM column and the object. This distance is also referred to as a working distance. The detector can also be placed within the SEM column.

Another type of known Charged particle beam device is the Focused ion beam (FIB) device. FIB systems are generally utilized to perform die milling and cross sectioning. The milled or cross sectioned die is usually analyzed by an inspection device, such as a SEM, to detect defects. FIB systems can also be utilized to generate FIB images. FIB systems include an ion source for generating an ion beam, a FIB lens system for focusing the ion beam to provide a focused ion beam and an ion beam deflector for deflecting the focused ion beam. A FIB system that is operative to generate a FIB image also has a detector and a processor. Usually, the ion source, the FIB lens system and the ion beam deflector are located within a column, which is commonly referred to as FIB column. The detector can also be placed within the FIB column.

SEM images are generated by irradiating an object with an electron beam, collecting signals resulting from an interaction of the electron beam with at least one portion of the object and processing the collected signals. FIB images are generated in a similar analogues manner, except that the object is irradiated with a focused ion beam.

Systems that include both FIB and SEM systems are known in the art and are referred to as FIB/SEM systems. SEM system allows to inspect a surface of an inspected object, such as a surface of a multi layered die. FIB systems allow for milling the surface and exposing inner layers to inspection. Usually, after the FIB mills the die, the SEM system is utilized to inspect the revealed layers and to further analyze the milled die for detecting defects.

There are known in the art other types of Charged particle beam devices such as Transmission Electron Microscope (TEM), and Scanning Transmission Electron Microscope (STEM).

Calibrating column parameters of a charged particle beam device is essential in order to obtain an optimal spot on the target surface (wafer). The characteristics of optimal spot are, for instance, spot size and how round and symmetric is the spot and it means whether the spot has astigmatism deviations for the x and y axes. When using high current beam, say $\geq 1$ nA, the spot is milled into the substrate, or in other words the process is destructive. In the case that the so milled spot is not optimal, it would be desired to adjust the operational parameters for generating a better spot. However, since the generation of the spots is "destructive" hampers, subsequent attempts to generate spots using possibly other parameters. The reason is that, when a high current beam is used, the resulting image is, in many cases, not clear, thereby hindering to inspect and determine the characteristics of the resulting spot.

Accordingly, the process of calibrating the operational parameters of high beam current charged particle beam device (such as FIB) is, in many cases, manual and time-consuming. It also strongly depends on the skills of the technician who performs the task, and therefore the quality of the resulting calibration process may vary from one individual to the other.

There is, thus a need in the art to provide for a new system and method facilitating calibration of column parameters of Charged particle beam devices, in particular those operating in high current.

RELATED ART

WO03005396A2: Method and Apparatus for Scanned Instrument Calibration

Methods and apparatus for calibration of a scanned beam system are provided by sampling a calibration specimen containing an array of targets with a spacing between samples that is greater than the spacing between targets in the array and forming an image from the samples to reduce calibration specimen degradation and to magnify calibration errors to enable very fine calibration of the scanned beam system.

A method for calibration of a scanned beam system, comprising the steps of sampling a specimen comprising an array of targets with a spacing between samples that is greater than a spacing between targets in the array; and obtaining information from the samples concerning calibration of the system WO0111656A1: Calibration of a Scanning Electron Microscope A scanning electron microscope (SEM) is calibrated for the effects of local charging on a measured critical dimension (CD) of a wafer by first calibrating the microscope with respect to a calibration wafer with a known CD. Local charging on a wafer may be measured as a local landing energy (LLE) so that a scale factor based on a ratio of LLEs for the measurement wafer and a calibration wafer is used to correct a measured CD for the measurement wafer.

U.S. Pat. No. 4,512,659: Apparatus for Calibrating a Surface Scanner

A test device for calibrating an optical scanner wherein microscopic patterns of light scattering elements simulate the scattering of light from particles or flaws of different sizes. Simulation of different particles sizes is achieved by means of clusters or arrays of these light scattering elements having different area wise densities. Patterns of such clusters or arrays are disposed on a surface with intervening spaces where a random assortment of foreign particles may be expected. In this manner, the foreign particles may be directly compared to a test pattern. The test surface may be a semiconductor wafer having a thin, inert coating with openings therein forming the light scattering elements. The openings may be made by photolithographic techniques, i.e., masking and etching, so that various patterns on a surface may be all created simultaneously by the same process.

U.S. Pat. No. 5,078,492: Test Wafer for an Optical Scanner

A patterned wafer for testing an optical scanner. The wafer has standard size light scattering features, such as pits, distributed in aligned groups arranged in annular bands about a concentric center. Empty annular bands separate the feature containing annular bands. The empty bands simulate wafer edges for various size wafers. In this manner, wafer edges may be excluded in a particle count for a predetermined size wafer. Apparent size variations in multiple scans indicate misalignments relative to the scan center.

U.S. Pat. No. 5,198,869: Reference Wafer for Haze Calibration

A standard for calibrating a wafer surface inspection optical scanner, particularly a system for measuring haze. The reference wafer contains sections divided into subsections, each subsection having a quasi-random pattern of light scattering features on an otherwise polished surface of the wafer. The quasi-random pattern of features is formed by creating a random pattern of pits within tiny areas of the subsection and repeating that pattern. The random pattern of pits covers an area less than the area of the spot of a scanning beam used by the wafer surface inspection system. By randomizing the pattern of pits within the scanning beam, the scattered light does not produce interference patterns and thus the scattered light is more isotropic. A direct measurement of the amount of hazel on the reference wafer can be obtained from measuring the amount of scattered light caused by the pits. Since this level of scattering is known beforehand to correspond to a certain level of haze, the wafer surface inspection system can then be calibrated to accurately measure haze on surfaces of non-reference wafers.

U.S. Pat. No. 6,670,610: System and Method for Directing a Miller

A system and method for directing the object, such as a semiconductor die. The system includes a first imager such as a scanning electron microscope, a stage for moving the object and a second imager and miller such as a focused ion beam generator. The object is for images to locate a desired location in which the object is to be milled and a landmark that is utilized for directing the miller. The system can include additional steps of milling, analyzing and movement of the object.

SUMMARY OF THE INVENTION

The present invention provides a method for calibrating operational parameters of a charged particle beam device, comprising: (a) generating a plurality of distinct spots on a specimen, each spot being generated in response to adjusted operational parameters of the charged particle beam device; (b) registering said respective operational parameters.

The present invention further provides a system for calibrating operational parameters of a charged particle beam device, comprising: (a) a unit for generating a plurality of distinct spots on a specimen, each spot being generated in response to adjusted operational parameters of the charged particle beam device; (b) a unit for registering said respective operational parameters.

Further provided by the present invention, is a computer program product comprising a computer useable medium having computer readable program code embodied therein for calibrating operational parameters of a charged particle beam device, the computer program product comprising: (a) computer readable program code for causing the computer to facilitate generating a plurality of distinct spots on a specimen, each spot being generated in response to adjusted operational parameters of the charged particle beam device; (b) computer readable program code for causing the computer to register said respective operational parameters.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF THE INVENTION

Note that, for convenience of explanation only, the invention will be mainly described with reference to Focused Ion Beam (FIB) system, however, those versed in the art will readily appreciate that the invention is, likewise, applicable to any charged particle beam device. Typical, yet not exclusive, examples being a Scanning Electron Microscope (SEM), Transmission Electron Microscope (TEM) and Scanning Transmission electron microscope (STEM). Note also that the invention is described with reference to a wafer specimen, however, it is applicable to other target objects. For convenience, reference is made to milling of spots on a specimen. Other destructive effects are also applicable. For convenience, the description refers to photo resist. This is only a non limiting example of a specimen and the invention is by no means bound by this example.

The structure and operation of the FIB are generally known per se and therefore will only be briefly described herein, in particular with reference to the Column components that are pertinent to the calibration of operational parameters of the FIB.

Figure 1:
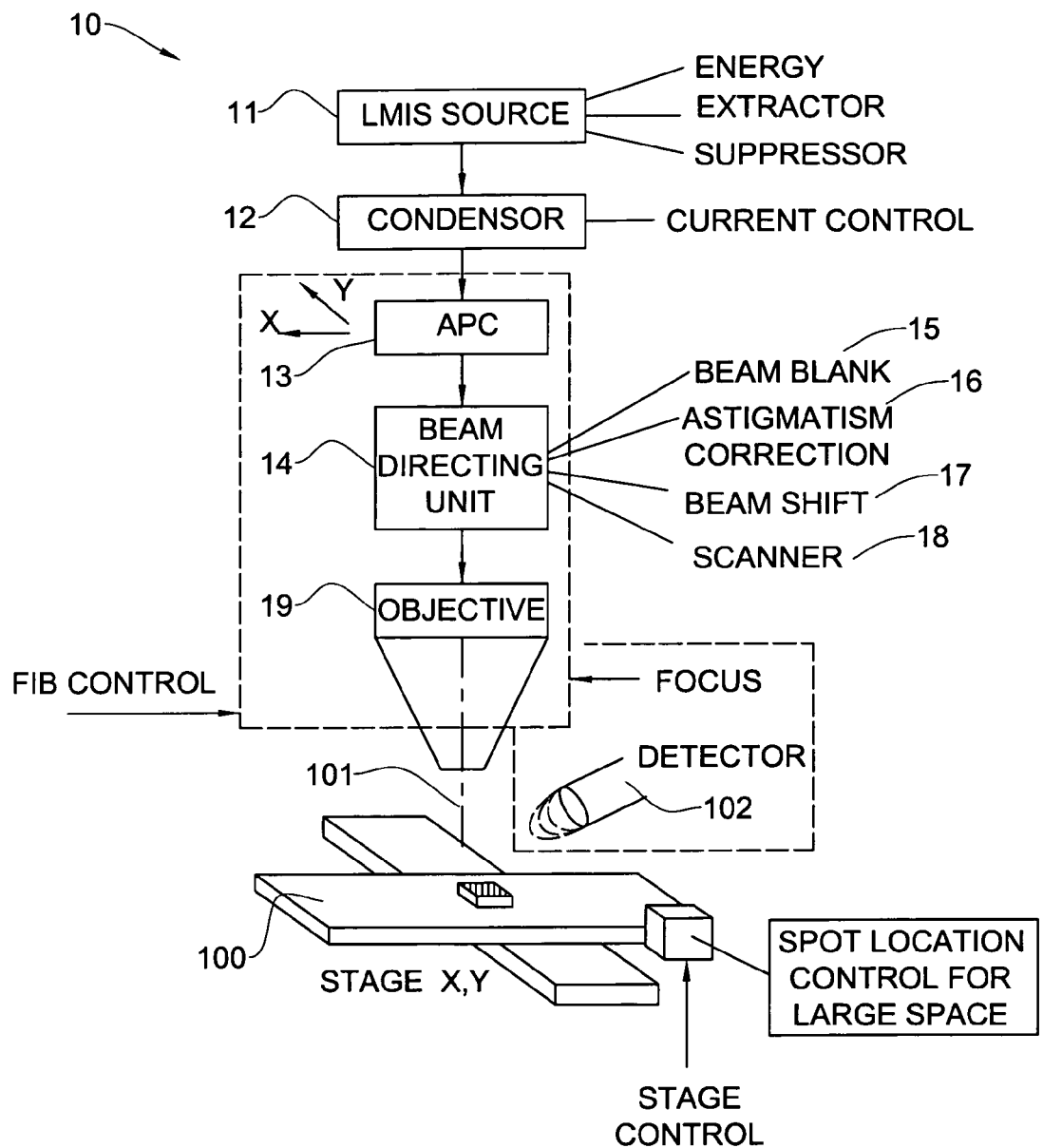
FIG. 1 is a generalized block diagram of a Focused ion beam (FIB) system.

Bearing this in mind, attention is first drawn to FIG. 1, illustrating a generalized block diagram of a Focused Ion Beam (FIB) system (10). The LMIS source (11) generates a beam of Ions that is directed to a condenser (12) for converging the Ion beam. The Ion beam is then directed to Aperture Position Control (APC-13) having a plurality of apertures through which the beam passes.

The APC has a set of apertures ranging from, say 10–800 microns. The larger the aperture through which the Ion beam passes, the higher the resulting beam current. The selected aperture is moved in the X-Y plane by means of two axes (X/Y) high accuracy motors. The Ion beam that passes through the selected aperture, is routed to Beam directing Unit (14) being operative to control various parameters of the beam. The Beam blank (BB) control (15) serves as beam enable/disable, which in the "enable" state, allows the beam to pass through towards the specimen (100), and in the "disable" state, neutralizes the beam by diverging it away from the target specimen. The Astigmatism correction (16) controls the astigmatism value of the beam and the Beam shift (17) allows controlled deviation of the beam for milling at different locations on the specimen's surface 100. The dual octupole deflector (18) (Beam direction unit) allow to control beam Astigmatism deviation, beam shift and beam scan on wafer surface.

The objective electrodes (19) allow to control the focus of the beam 101 that impinges on the surface of wafer 100, giving rise to milling of the spot thereon.

Detector 102 and at least one processor (not shown) coupled to the detector being operative to generate a succession of images. An image is generated by processing received electrons reflected from the specimen 100 in response to the incident Ion beam 101.

Figure 2:
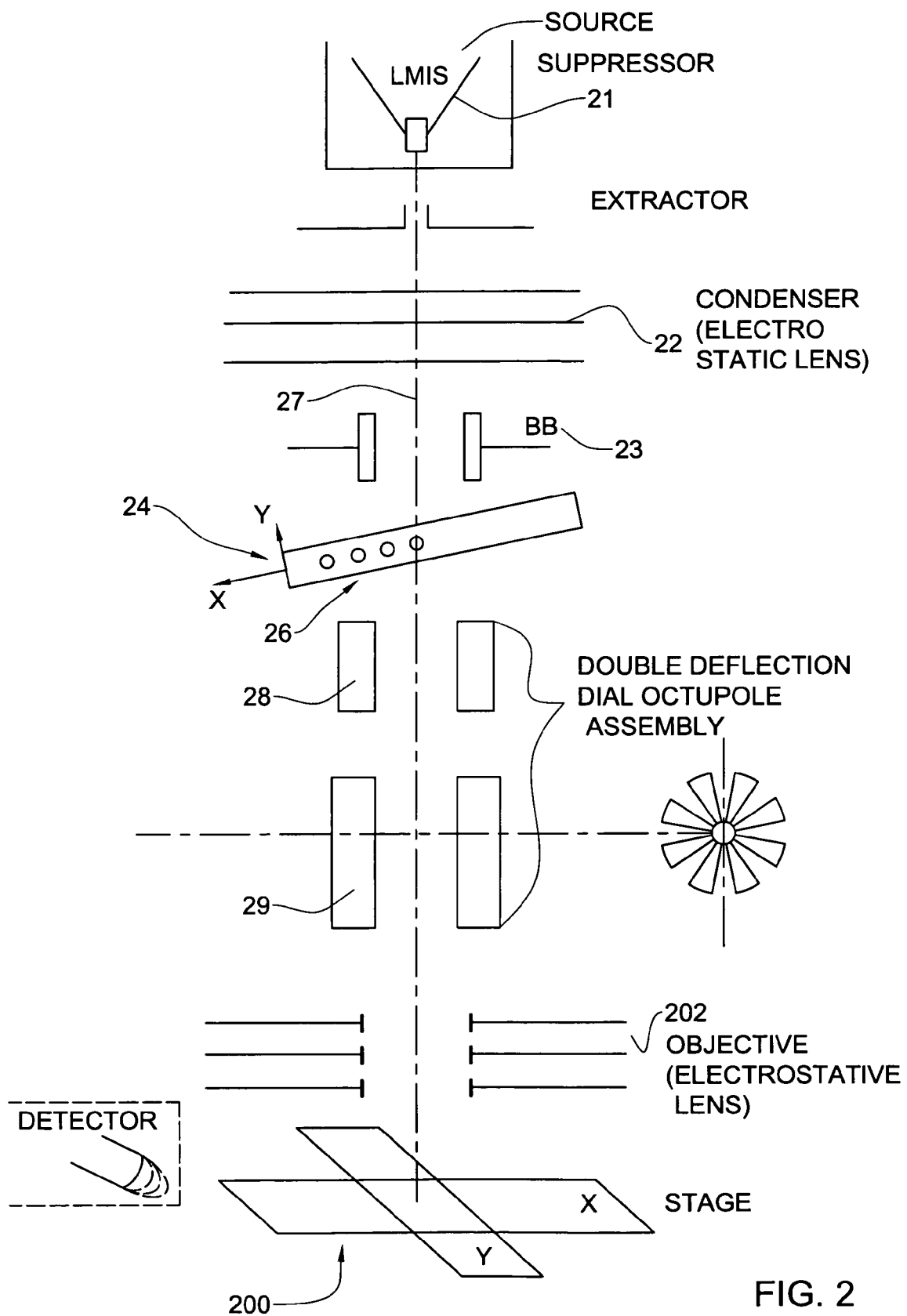
FIG. 2 is a schematic illustration of a column in a Focused ion beam (FIB) system.

Attention is drawn to FIG. 2, illustrating schematically a column (20) in a Focused ion beam (FIB) system. Note that in the context of the invention the terms device and system are used interchangeably.

Reverting to FIG. 2, the LMIS (21) and condenser (22) were described with reference to FIG. 1. As further described in FIG. 1, the application of voltage to the BB (Beam Blank) electrodes (23) allows for enable or disable the beam operation. The input voltage to X/Y motors (shown, schematically, as 24 and 25) directs a selected aperture (26) through which the Ion beam (27) passes. The Double deflection Dual Octupole assembly (28) allows to provide potential difference to the electrodes 28 to affect the astigmatism value of the resulting spot (in either or both of the X and Y axes) and by means of DC voltage level applied to electrodes 29 the deflection extent of the beam is set which, in turn, determines the incident beam location on specimen 200 that is located on stage 201.

The DC voltage applied to electrostatic lens 202 (constituting the objective) will determine the focus extent of the beam.

Wobble alignment is used to align optical element (such as emitter and aperture) to the effective lens symmetry. By doing this alignment, optical aberration is reduced and accordingly optimal column conditions are achieved for small and symmetric beam spot.

In accordance with certain embodiments, wobble alignment parameters are one or more of the following: lens voltage for electrostatic lens, alternating lens current for magnetic lens and column alternating energy voltage. Adjusting any of these parameters would affect APC and/or emitter X Y location. For example, in order to align aperture position by APC unit, the alternating lens voltage (for electrostatic lens) is adjusted and in parallel the position of column live image is analyzed in order to determine whether the image is wobbling in the screen. If in the affirmative, there is a need to change the aperture position by using APC unit until the live image is not moving or wobbling in the screen (and only the image focus is possibly affected).

Accordingly, in the context of the specific example illustrated in FIGS. 1 and 2, the operational parameters that can affect the characteristics of the resulting spot are (i) the input voltage applied to the X/Y motors of the APC, which will determine the aperture size through which the Ion beam passes and, in its turn, the current intensity of the Ion beam, such that the higher the current the more intense is the milling of the spot onto the specimen surface; (ii) the voltage difference applied to the (Dual Octupole Unit) electrodes, thereby affecting the astigmatism value of the resulting spot (in either or both of the X-Y axes); (iii) the duration of the milling controlled by the enable/disable command applied to the BB electrodes, such that the longer the duration, the more intense is the milling, and (iv) the DC voltage applied to the electrostatic lens, affecting the focus of the beam, and thereby the size of the resulting spot (v) Wobble parameters, as described with reference to certain embodiments above.

Note also that the DC voltage applied to the electrodes 29 will determine the deflection angle of the beam and thereby the location of the resulting spot on the surface of the specimen.

Note that the invention is not bound by the specific structure of FIB described with reference to FIGS. 1 and 2.

In certain embodiments of the invention, one or more of the specified parameters may be adjusted in the calibration process of the operational parameters, all as described in more detail with reference of FIG. 3 below. Note also that, in accordance with certain embodiments, one or more other parameters may be used in addition or in lieu of one or more of the specified parameters, all depending upon the particular application.

Figure 6A:
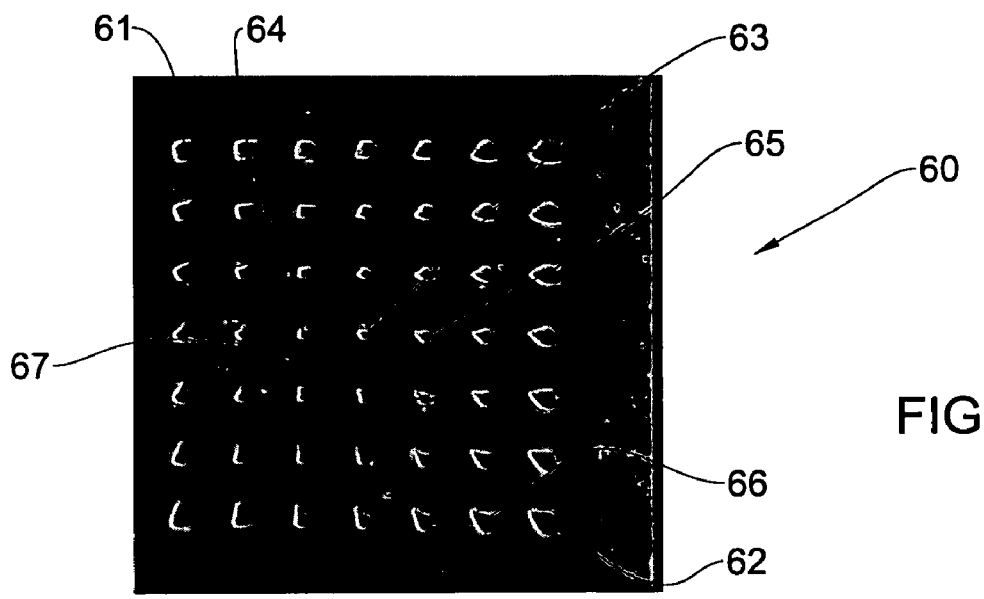
FIGS. 6A–B illustrate matrices of specimens, each accommodating a plurality of spots resulting from a calibration process, in accordance with an embodiment of the invention.
Figure 6B:
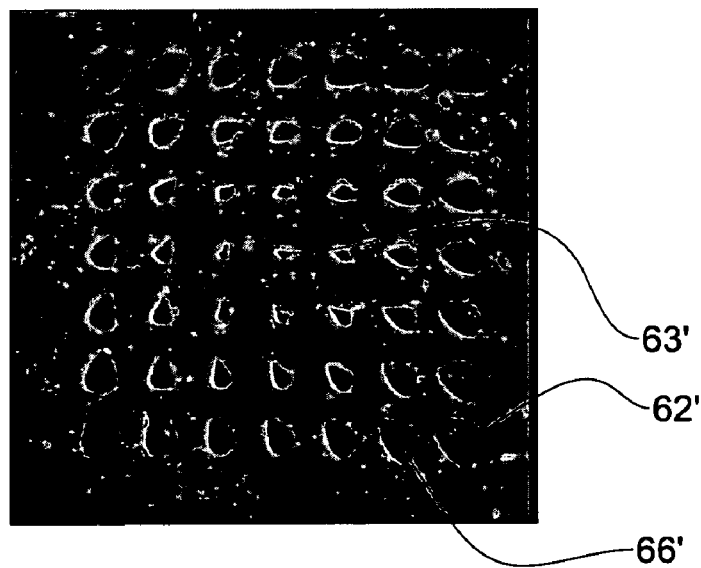

Before turning to describe a sequence of operation in accordance with certain embodiments of the invention, attention is drawn to FIGS. 6A–B showing two reference examples of samples (by this example matrices) with spots milled thereon. The reference samples will serve for better understanding the underlying concept of the invention. By the term "reference" sample, it is meant that the operational parameters of the column of the FIB which will give rise to an optimal spot are a priori known. Thus, based on these parameters, an optimal spot is generated and then one or more parameters are modified (e.g. the astigmatism value is changed each time in a pre-defined delta, in either or both of the X and Y axes) giving rise to the generation of the respective other spots. The reference sample will illustrate that the spots generated by using operational parameters other than the "optimal" parameters, will give rise to degraded spots (e.g. larger and subject to astigmatism).

In contrast to the specified reference specimen (which are provided for clarity of explanation only), in real-life operation, a sample (other than a reference) is generated, obviously, without any a priori knowledge of the parameters that would lead to generation of the optimal spot. In accordance with certain embodiments, after having generated the spots, the resulting spots are inspected manually, or in full (or semi) automatic fashion in order to determine the optimal spot, and thereby extract the optimal parameters, allowing to calibrate the column parameters accordingly.

Bearing this in mind, attention is drawn to FIG. 6A illustrating a reference sample. As shown, specimen 60 accommodates 49 spots, each having (x,y) offset ranging from (0,0) (spot 61) to (6,6) spot (62). Spot (63) at offset (3,3) was generated after having calibrated manually the operational parameters of the column to a priori known optimal values. A given parameter (in this particular case astigmatism value for the x and/or y axes) is tested (i.e. dynamically changed) and other parameters are retained invariable. Thus, by this particular example, the beam current is set to 1000 pA and other parameters such as focus size are set to a fixed value. The astigmatism correction step is set to 1V, meaning that for any neighboring spots the difference in the voltage levels applied to the electrodes, (say 28 in FIG. 2) is 1V (hereinafter correction step). Note, that in certain embodiments, an increment of the X offset by "1" would lead to increment by a correction step (e.g. +1V) of the voltage applied to the electrode that controls the X axis astigmatism (e.g. from the spot at offset [3,4] (65) to the spot at the offset [4,4] 67). Similarly, an increment of the Y offset by "1" would lead to increment by a correction step (e.g. +1V) of the voltage applied to the electrode that controls the Y axis astigmatism (e.g. from the spot at offset [3,3] (63) to the spot at the offset [3,4] (65)). Also, in accordance with the specified embodiments, an increment in both the X and Y offsets by "1" would lead to increment by the correction step (e.g. 1V) of the voltage applied to the electrodes that control both the X and Y axes astigmatism (e.g. from the spot at offset [3,3] (63) to the spot at the offset [4,4] (67)).

By this example, the distance between neighboring spots in each raw is 3 μm and this is achieved by providing appropriate DC voltage to input 29 (see FIG. 2) which affects the beam shift angle and in response determines the incident beam location onto specimen 60.

As shown in FIG. 6A, the larger the distance (in the specimen) from the optimal spot (63) the lesser the quality of the spot. Thus, the optimal spot 63 is small in size and has a round shape. The near neighboring spots appear almost the same (say, spot 64 at offset (4,3) or spot 65 at offset (3,4)) whereas more distant neighbors (such as 62 or 66) appear in larger size and less round form (or, in other words, subject to more astigmatism). Note that if the voltage applied to the electrodes that control the astigmatism value of the optimal milled spot (63) is X volts, then the voltage applied to the electrodes that control the astigmatism value of the near neighboring spots 64 and 65 are Y volts where |Y−X|=1V The minor difference of only |1V| gave rise to very small effect on the resulting form of spots (64 and 65) compared to the optimal spot (63). In contrast, the relatively large change (compared to X volts of the optimal spot) in the input voltage applied to the electrodes that control the astigmatism value when milling distant spots (62) and (66) clearly gave rise to degraded form of the latter. Thus, it is readily evident from FIG. 6A that (compared to the optimal spot 63), spots (66) and (62) are larger in size and have an evident non-round form with a manifested astigmatism. FIG. 6B illustrates a similar scenario to that described with reference to FIG. 6A, (where spot 63' is optimal) except for the fact that the correction step is set to a larger value of 2 Volts (Vs. 1V used in the example of FIG. 6A). Due to the larger correction step, the effect on the astigmatism is more evident and as readily shown spots 62' and 66' are considerably larger in size and manifest more astigmatism compared to spots 62 and 66 having respective corresponding offsets in the specimen of FIG. 6A.

Obviously, the invention is not bound by using a matrix form specimen and a fortiori not of 7 by 7 size. Accordingly the size of the sample (i.e. how many spots and the arrangement thereof) as well as the distance between the spots may be determined according to the particular application.

Figure 3:
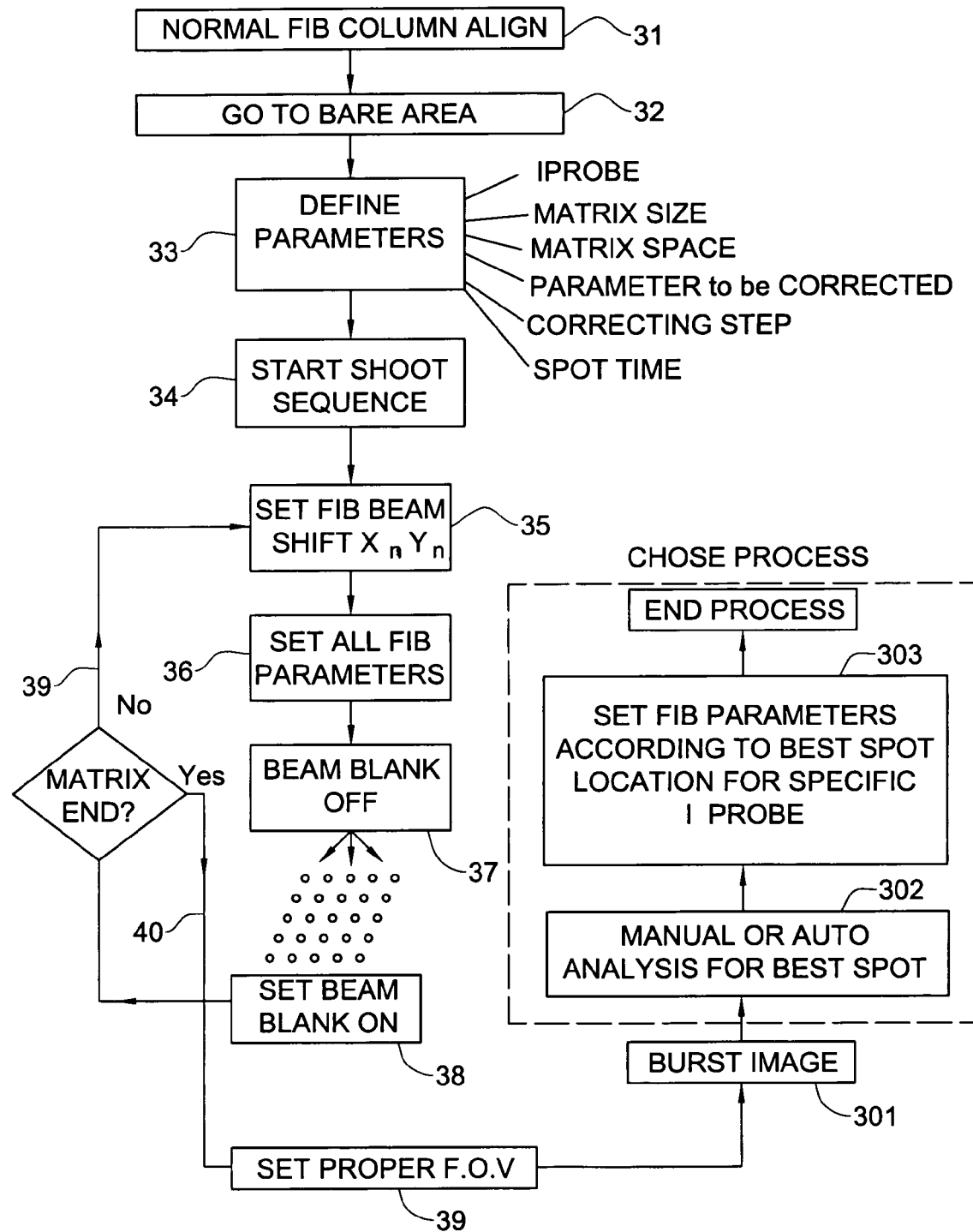
FIG. 3 is a flow diagram illustrating a calibration sequence of operation, in accordance with an embodiment of the invention.

Bearing this in mind, attention is drawn to FIG. 3 illustrating a flow diagram of a calibration sequence of operation, in accordance with certain embodiments of the invention. Thus, at the onset a known per se manual column alignment step is performed (31), including best focus, wobble and astigmatism on clear pattern.

In accordance with certain embodiment, this is achieved by applying, at the onset, manual coarse alignment for high beam current by using focus, astigmatism and wobble X and Y axis alignment options to get the best image by human vision observation on wafer pattern. Note that, as a rule, this preliminary manual operation would not give rise to an optimal generated spot, and accordingly the quality of the generated spot may vary according to the skills of the individual technician who carries out this manual calibration procedure. Thereafter, the beam is directed to a bare area (32) constituting the specimen of interest. To this end, the beam blank and the beam shift controls are activated, in a known per se manner. Next, selected parameter or parameters of interest are chosen for calibration (33). In accordance with certain embodiments, the operational parameters being at least one of: astigmatism value, focus value, wobbles value, beam current value and spot milling time. Note that in the example illustrated above with reference to FIG. 6A, only the astigmatism value parameter was used. Note also that at this stage, in addition to the selected parameters, also correction step is selected as well as the specimen characteristics, such as matrix size (including number of spots), as well as the beam shift angle prescribing the distance between neighboring spots.

In accordance with certain embodiments, the characteristics of interest may be fed as an input in a form of a file, say, high beam current calibration parameters input parameters. The file includes specification of the parameters of interest such as (Focus increment, Astigmatism increment, Wobble increment, Milling time, displacement space). In the latter example, the Focus, Astigmatism and wobble are tested and their corresponding entries in the file would indicate the correction step that is applied (incremented) for each spot. This will be further exemplified with respect of a non-limiting example of FIG. 6. The file further specifies the milling time per each spot and the distance between neighboring spots. The invention is, of course, not bound by the specified form of input (namely file/s), and obviously not by the specific content described above. Thus, in accordance with certain embodiments, other parameters (e.g. beam shift energy) can be used in addition or in lieu of the specified parameters. In accordance with certain embodiments, the correction step in respect of at least one of the parameters may be variable, each modified in a different values in two or more iterations. In accordance with certain other embodiments, the correction step for a given parameter is identical at each iteration. (This option is exemplified in FIG. 6, below)

Based on the set parameters, the milling action is activated by triggering on the beam (34) which, inter alia, will disable the Beam Blank allowing the beam to impinge on the surface of the sample at the designated location (according to the set beam angle) and mill the spot onto the surface. When the pre-defined milling time has been elapsed, the BB is turned on, thereby disabling the beam and terminating the milling action.

Next, a new destination of the next spot is selected (35) (by altering the beam angle in a predetermined correction step) and the parameters are set to a new value according to the correction step (36). The beam blank is turned off to commence the milling of the new spot on the specimen (37), until disabling the beam (by activating Beam Blank) after the designated milling duration has been elapsed (38).

The procedure is repeated (39) until the entire matrix is completed (40). In the specific example illustrated with reference to FIGS. 6A and 6B, the procedure is repeated 49 times so as to generate respective 49 spots.

In accordance with certain embodiments, the entire milling process would be about 2 sec per spot.

In certain embodiments, the same correction step is applied for each iteration. In certain embodiments, a different correction step is applied in one or more iterations. In accordance with certain embodiments, the different correction step is applied in respect of the same parameter (for instance, for one or more iterations, instead of applying a correction step of 1V [for the astigmatism value], a correction step of 2V is applied). In accordance with certain embodiments, at least one different parameter is adjusted in one or more iterations. For instance, in one or more iterations, in addition to the astigmatism value, also the beam intensity value is calibrated. Other variants of employing the parameters, number of spots, distance there between, and or correction steps may be employed.

The remaining section of FIG. 3, concerns inspection of the so milled spots, as will be described in greater detail below.

In accordance with certain embodiments, the application of the correction step in respect of the distinct spots is applied automatically.

Thus, for example, with reference to the example of FIG. 6A, where the calibrated parameter is an astigmatism value, the new offset location of the spot on the matrix specimen and the corresponding correction spot, comply with the following equation:

$X_{NEW}=X_p+(X_n-Xc)\cdot$Correction step $Y_{NEW}=Y_p+(Y_n-Yc)\cdot$Correction step Where:

$X_{NEW}$, $Y_{NEW}$ represent the new value of the parameter $X_p$, $Y_p$ represent a reference value of the parameter (say, $X_p$ stands for a "starting" voltage for the X axis astigmatism and $Y_p$ stands for a "starting" voltage for the Y axis astigmatism)

Xn, $Y_n$ signify new a beam location

Correction step: signifies the correction step (say 1V in FIG. 6A and 2V in FIG. 6B)

Xc, $Y_c$ represent the matrix center.

For a better understanding, attention is drawn again to FIG. 6A, where Xc, $Y_c$ stand for the spot (63) milled at offset (3,3), i.e. the matrix center. Assume also that $X_p$, $Y_p$ are the reference voltage values applied to the electrodes that control the X astigmatism value, and Y astigmatism value for spot 63. The new astigmatism values $X_{NEW}$, $Y_{NEW}$ for the near neighbor spot at offset (3,4) (i.e. spot (65)) are as follows:

since $X_n$=Xc (both having the value 3), then $X_{NEW}=X_p$.

$Y_{NEW}=Y_p+(4-3)\cdot 1V$. Namely, the astigmatism value applied for the Y electrode for milling spot (65) would be in 1V higher compared to the voltage ($Y_p$) applied to the electrode when milling the optimal spot (63).

Applying the equations to spot (67) at offset (4,4) would lead to $X_{NEW}=X_p+1V$ and $Y_{NEW}=Y_p+1V$ In accordance with another example applying the equations to spot (62) at offset (6,6) would lead to new astigmatism values $X_{NEW}=X_p+3V$ and $Y_{NEW}=Y_p+3V$. The deviation in 3V in both the X and Y axes would lead to more evident astigmatism as readily shown in FIG. 6A.

The invention is, of course, not bound by the specified example of automatic application of correction step in accordance with the spot location. It should be generally noted that, in accordance with certain embodiments, the operational ranges that may be employed for the various operational parameters of the FIB, are: Focus values: 0–22,000V; Astigmatism value: 0–100V (in the X axis and Y axis); Wobble: (for x,y: DC motor with an accurate optical encoders). For aperture range, the entire move along the X axis is 30 mm and for the Y axis is 10 mm. The accuracy step is of ~1 um for selecting one of the following 10 um, 20 um, 50 um, 100 um, 150 um, 200 um, and 400 um.

Having generated a specimen accommodating a plurality of spots, it would be desired, in accordance with certain embodiments, to select a spot of interest. In accordance with certain embodiments, the selected spot is an optimal spot in terms of small symmetry and roundness. Once a spot is selected, its corresponding parameters are extracted and the column can be calibrated accordingly.

Figures 4, 5:
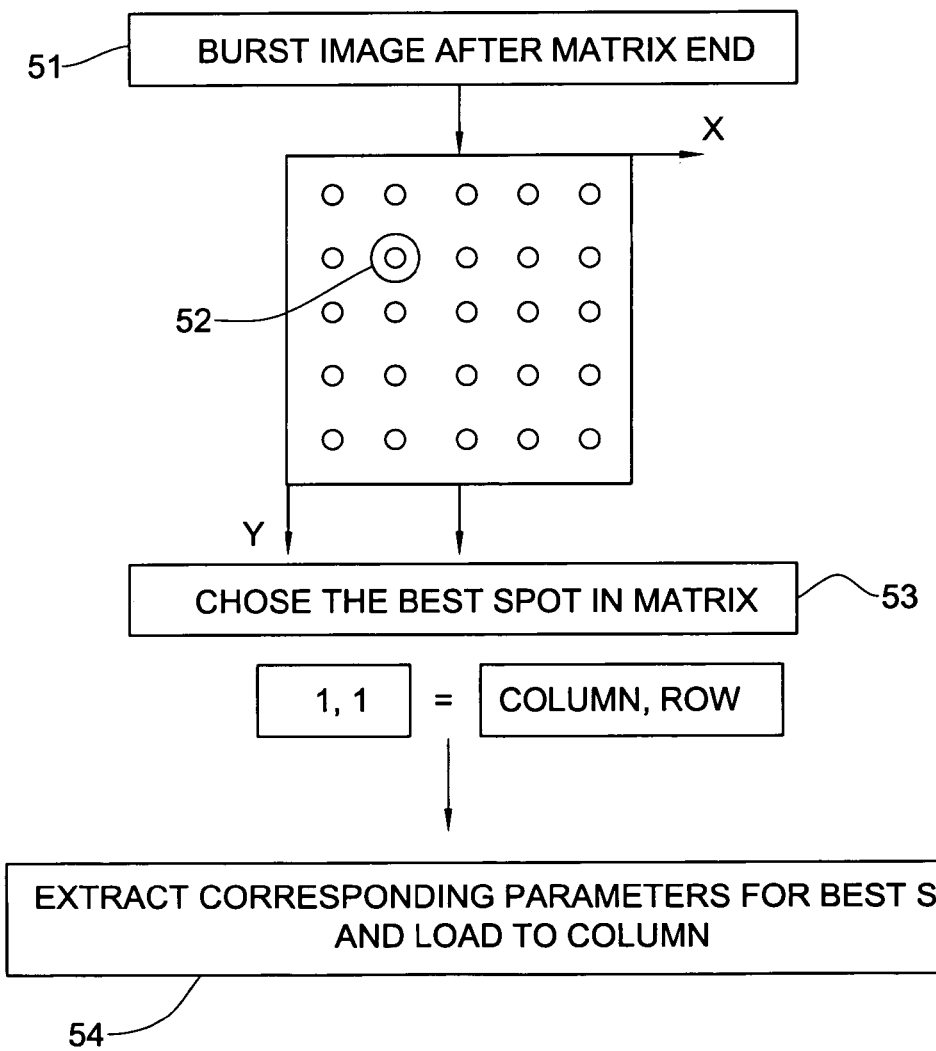
FIG. 4 is a schematic illustration of a data structure for storing registered operational parameters, in accordance with an embodiment of the invention.
FIG. 5 is a schematic illustration of an inspection process, in accordance with an embodiment of the invention.

To this end, during the milling process described above, the parameter values that correspond to each generated spot are registered. In this connection, attention is drawn to FIG. 4, illustrating schematically a data structure for storing registered operational parameters, in accordance with an embodiment of the invention. By this particular example, the data structure, say a file that stores records, each record stores parameter values that correspond to a given spot. In the example of FIG. 4, a sample record 40 illustrates schematically, and it stores the data that pertains to a given spot, such as Ip (Probe current), matrix size (for all the spots), space between neighboring spots (applicable for the entire matrix).

In addition, the record provides the specific parameter values for this given spot, including the astigmatism correction (for this specific case only by using the equation Xnew and Ynew). In the example of FIG. 4, F, A and W values, stand for Focus, Astigmatism and Wobble), and the time stands for the milling duration time.

The invention is, of course, not bound by any specific data structure and/or the content thereof and accordingly the record structure and content as illustrated in FIG. 4, are provided as an example only.

Bearing this in mind, there follows a description of an inspection phase for selecting an optimal spot in accordance with certain embodiments of the invention. Note that the inspection phase can be manual (i.e. based solely on the inspection skills of the operator), or in accordance with other embodiments semi-automatic or fully automatic.

For a better understanding of the foregoing, attention is drawn again to FIG. 3. As may be recalled steps 31–38 gave rise to the generation of the specimen.

After having generated the specimen, an inspection phase commences. The inspection can be performed using the FIB detector and associated processor, or if desired other inspection means such as the SEM. A consecutive milling and inspection operations using FIB and SEM, respectively, are generally known per se and described, e.g. in U.S. Pat. No. 6,670,610 "system and method for directing a miller", whose contents is incorporated herein by reference. Thus, using the inspection tool, a proper FOV (field of view depending upon column scanner) is selected 39 (taking into account the matrix size and the distance between neighboring spots) and a burst image is triggered to generate an image (301) of the inspected matrix, all as known per se. Thereafter, a manual, semi-automatic or fully automatic process is used to identify the optimal spot (302), and once the optimal spot is identified, its corresponding parameters are extracted (303), using, say the data structure described with reference to FIG. 4. Note that in the case that semi-automatic or automatic procedure is used in step 302, this would involve in accordance with certain embodiments applying known per se image processing techniques, used to determine how round is the spot, etc. Thus, in accordance with certain embodiments, such an automatic technique includes applying image threshold and thereafter find morphologic close image or use Blob function background and foreground state. Then, calculate the area of close shape, search for small one having ratio of, say near to 1 for maximum diameter/minimum diameter. The invention is, of course, not bound by this specific atomization technique.

Having identified the optimal spot and extracted its corresponding parameter values, the column can be calibrated according to the so extracted parameter values (303) and the FIB can be used in a normal mode of operation using the specified calibrated operational parameters. It is expected that the FIB will now generate optimal spots in its normal course of operation.

A similar procedure is illustrated in FIG. 5, where after having generated an image of the matrix (51), the optimal spot is identified (52) (say at offset 1,1), and the location data is fed to the data structure to extract the corresponding parameter values (53). The so extracted values are fed and stored as column parameters for the subsequent operational stages (54).

The description with reference to FIGS. 1–6 above, referred to calibrating parameters of a FIB. As specified above, the invention is not bound to FIB and accordingly, it is applicable to other charged particle beam devices.

Figure 7:
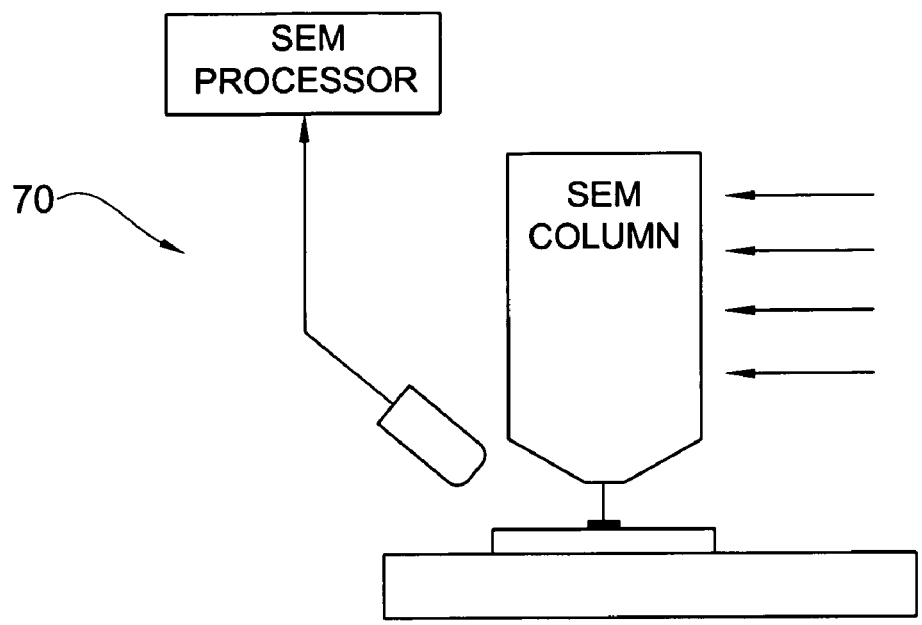
FIG. 7 illustrates a generalized system architecture, in accordance with another embodiment of the invention.

FIG. 7 illustrates a generalized system architecture, in accordance with another embodiment of the invention. FIG. 7 illustrates schematically a column of a SEM 70 and the appropriate parameters that can affect the characteristic of the resulting spot are marked as an input to the SEM column. Similar to the FIB, here also one or more of the specified parameters may be tested. Note that the invention is not bound by the specified list of parameters. A typical, yet not exclusive operational range of the parameters is as follows:

| SEM | |
|---|---|
| Gun alignment | x.y 0 ÷ 200 mA |
| Aperture alignment | x.y 0 ÷ 200 mA |
| Astigmatism | x.y 0 ÷ 200 mA |
| Focus | 855 mA, 0 ÷ 2 Amps |
| Beam energy | 1 Kv, 0V – 15 Kv |
| Cup voltage | 0V, 0V – 5 Kv |
| Wafer Bias | 0V, 0V – 2 Kv |
| Column voltage | 8 Kv, 0 – 10 Kv |

Note, incidentally, that when a SEM is used in accordance with the teachings of the present invention, it is assumed that its beam current is high enough to generate a milling effect on the sample (such as Electron Beam Photo Resist).

Figure 8:
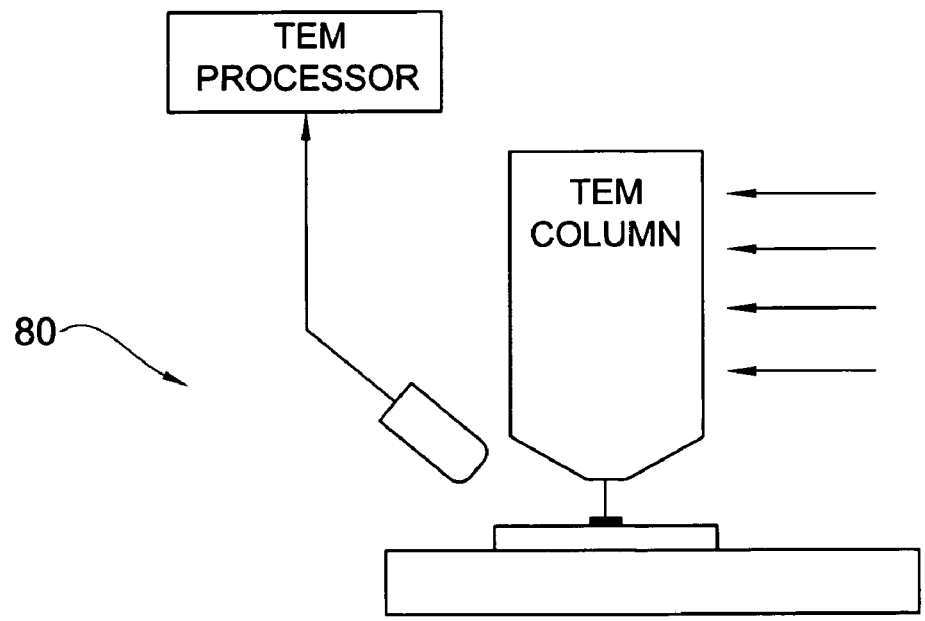
FIG. 8 illustrates a generalized system architecture, in accordance with another embodiment of the invention.

Turning now to FIG. 8, it illustrates a generalized system architecture, in accordance with another embodiment of the invention. By this example, the charged particle beam device that is used is a TEM. FIG. 8 illustrates schematically a column of a TEM 80 and the appropriate parameters that can affect the characteristic of the resulting spot are marked as an input to the TEM column. Similar to the FIB, here also one or more of the specified parameters may be tested. Note that the invention is not bound by the specified list of parameters. A typical, yet not exclusive operational range of the parameters is as follows:

| TEM | |
|---|---|
| Beam energy Acc | 100 Kv–200 Kv |
| Filament current | 2.5 Amps–5 Amps |
| Extractor voltage | 5.5 Kv–11 Kv |
| Suppressor voltage | 500 V–1000 V |

The present invention has been described with a certain degree of particularity, but those versed in the art will readily appreciate that various alterations and modifications may be carried out, without departing from the scope of the following Claims:

The invention claimed is:

1. A method for calibrating operational parameters of a charged particle beam device, comprising:
   (a) generating a plurality of distinct spots on a specimen, each spot being generated in response to adjusted operational parameters of the charged particle beam device;
   (b) registering said respective operational parameters.

2. The method according to claim 1, wherein said charged particle beam device being a high current charged particle beam device, and wherein said (a) includes milling the plurality of spots on the specimen.

3. The method according to claim 2, wherein said current being $\geq 1$ ηA.

4. The method according to claim 1, wherein said charged particle beam device is a Focused Ion Beam (FIB) device.

5. The method according to claim 4, wherein said parameters being at least one of spot astigmatism value, spot focus size, wobble value, beam current intensity and spot milling time.

6. The method according to claim 5 wherein said spot astigmatism value can be determined by applying voltage difference to electrodes; said focus size can be determined by applying DC voltage to electrostatic lens; said wobble value can be determined by; said current intensity can be determined by applying input voltage to X/Y motors of an APC of said FIB; milling time can be determined by enable/disable command applied to Beam Blank electrodes.

7. The method according to claim 5, wherein at least one of said parameters is adjusted according to a correction step.

8. The method according to claim 7, wherein the same correction step is applied in all iterations.

9. The method according to claim 7, wherein different correction step is applied in one or more iterations.

10. The method according to claim 7, wherein different correction step is applied in respect of the same parameter.

11. The method according to claim 5, wherein an astigmatism value is adjusted in accordance with the following equation:

$$X_{NEW} = X_p + (X_n - X_c) \cdot \text{Correction step}$$

$$Y_{NEW} = Y_p + (Y_n - Y_c) \cdot \text{Correction step}$$

Where:
   $X_{NEW}$, $Y_{NEW}$ represent a new value of the parameter
   $X_p$, $Y_p$ represent a reference value of the parameter
   Xn, $Y_n$ signify new a beam location
   Correction step: signifies a correction step
   Xc, $Y_c$ represent a matrix center.

12. The method according to claim 1, further comprising:
   (c) inspecting the plurality of spots for determining selected spot.

13. The method according to claim 12, wherein said inspection is automatic or semi automatic.

14. The method according to claim 12, wherein said selected spot being an optimal spot.

15. The method according to claim 13, wherein said selected spot being an optimal spot.

16. The method according to claim 12, further comprising: extracting the parameters that correspond to said selected spot, and setting the operational parameters of the device according to the extracted parameters.

17. The method according to claim 1, wherein said charged particle beam device is a Scanning Electron Microscope (SEM).

18. The method according to claim 17, wherein said parameters being at least one of: Gun alignment, Aperture alignment, Astigmatism, Focus, Beam energy, Cup voltage, Wafer Bias and Column voltage.

19. The method according to claim 1, wherein said charged particle beam device is a Transmission Electron Microscope (TEM).

20. The method according to claim 19, wherein said parameters being at least one of: Beam energy Acc, Filament current, Extractor voltage and Suppressor voltage.

21. The method according to claim 1, wherein said charged particle beam device is a Scanning Transmission electron microscope (STEM).

22. A system for calibrating operational parameters of a charged particle beam device, comprising:

a) a unit for generating a plurality of distinct spots on a specimen, each spot being generated in response to adjusted operational parameters of the charged particle beam device;

b) a unit for registering said respective operational parameters.

23. A computer program product comprising a computer useable medium having computer readable program code embodied therein for calibrating operational parameters of a charged particle beam device, the computer program product comprising:

a) computer readable program code for causing the computer to facilitate generating a plurality of distinct spots on a specimen, each spot being generated in response to adjusted operational parameters of the charged particle beam device;

b) computer readable program code for causing the computer to register said respective operational parameters.

* * * * *